United States Patent
Ota

(10) Patent No.: US 6,402,527 B2
(45) Date of Patent: Jun. 11, 2002

(54) STRUCTURE FOR CONNECTING TERMINALS ON WIRING BOARD

(75) Inventor: Tsutomu Ota, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/821,799

(22) Filed: Mar. 30, 2001

(30) Foreign Application Priority Data

Mar. 30, 2000 (JP) ......................................... 2000-095696

(51) Int. Cl.[7] ............................................... H01R 12/00
(52) U.S. Cl. .......................................................... 439/67
(58) Field of Search ........................... 439/67, 65, 876; 174/88 R

(56) References Cited

U.S. PATENT DOCUMENTS 5,683,788 A * 11/1997 Dugan ......................... 428/209
6,040,529 A * 3/2000 Takeshita et al. ........... 174/254

* cited by examiner

Primary Examiner—Khiem Nguyen
(74) Attorney, Agent, or Firm—Pillsbury Winthrop LLP

(57) ABSTRACT

In a structure for connecting terminals on wiring boards, lands on a wiring board are respectively connected with lead terminals on another wiring board through solder. Outline of each land has a bump and a recess respectively on edges facing to terminal arranging direction. Meanwhile the lead terminals are rectangular. In plan view, the recess protrudes from an edge of respective lead terminal while protrusions on ends of the recess protrude from another edge of the respective lead terminal. Even when position of the each land to the respective lead terminal deviates not so excessively, the bump and the protrusion protrude from outline of the lead terminal. Thus, on each of such protruding portions, visible fillets of the solder are formed.

12 Claims, 3 Drawing Sheets

STRUCTURE FOR CONNECTING TERMINALS ON WIRING BOARD

BACKGROUND OF THE INVENTION

This invention relates to a structure for connecting terminals, in which lands on a wiring board are connected with lead terminals on other substrate through solder or the like.

Conventionally, as such structure for connecting terminals, a structure of Prior Art 1 shown in FIG. 4 is known, for example.

In the structure of Prior Art 1, near-square-form rectangular lands 11 are arranged in a side-by-side manner on a wiring board by pitch of 0.5 mm. Rectangular lead terminals 21 on other substrate are superimposed on the lands 11. Long edges (long sides) 23,24 of the lead terminals 21 are longer than respective long edge 13,14 of the lands 11 by 0.1 mm, while short edges (short sides) 22 of the lead terminals 21 are shorter than respective short edges 12 of the lands by 0.1 mm.

As shown in the FIG. 4, the long edges 23,24 of the lead terminals 21 outwardly distanced from the respective long edges 13,14 of the lands 11 by 0.05 mm when the lands 11 and the lead terminals 21 are exactly in a designed position with each other. If the lands 11 and the lead terminals 21 are bonded through solder or similar conductive adhesives by automatic thermo-compression bonding in use of heat tool, fillets 5 of the solder or the like are formed on fringe portions on the lands 11 that outwardly protrude from the long edges 23,24 of the lead terminals 21.

The structure shown in the FIG. 4 is disadvantageous because even a 0.05 mm rightward or leftward deviation of the position of the lands 11 with respect to the lead terminals 21 makes the fillet 5 on right-hand side or left-hand side invisible from upper side through the other substrate, which has the lead terminals 21.

On the other hand, FIG. 5 shows another example of the conventional structure for connecting terminals, as designated as Prior Art 2.

In the structure of Prior Art 2, lands 11 as well as lead terminals 21, each of which is superimposed to respective one of the lands 11, are in a form of isosceles trapezoid, with longer base edges 18 of the lands 11 being opposed to longer base edges 19 of the lead terminals 21. As shown in the FIG. 4, legs or oblique edges of the each land 11 and respective lead terminal 21 are intersected with each other, while shorter base edge 28 of the each lead terminals 21 is placed within the respective land 11 when exactly placed as designed. The fillets 5 are formed along imposed-on-the-land portion of outline of the lead terminal 21. In a designed position, the longer base edge 18 of the land 11 is outwardly distanced from the shorter base edge 28 of the lead terminal 21 by 0.05 mm, while the shorter base edge 19 of the land 11 is inwardly distanced by 0.05 mm from the shorter base edge 29 of the lead terminal 21.

The structure shown in the FIG. 5 is disadvantageous because the fillet 5 becomes difficult to be recognized when position of the lead terminal 21, which is superimposed on respective land 11, is deviated in a length-wise or height-wise direction (Y direction) of the land 11 and lead terminal 21. The Y direction is perpendicular to a direction along which terminals are arranged. When the shorter base edge 28 of the land 11 is placed outward from the longer base edge 18 of the lead terminal 21, the imposed-on-the-land portion of outline of the lead terminal 21 becomes short-sized. Thus, the fringe portion for the fillet 5 becomes short-sized, to make the fillet 5 be difficult to be recognized.

When size of the lead terminal 21 is larger than that of the lands 11, in particular, the lead terminal 21 would cover the land 11 almost entirely. In this way, the imposed-on-the-land portion of outline of the lead terminal 21 would become only tiny bits along legs or oblique edges of the lead terminal 21. Thus, the fillet 5 becomes difficult to be recognized. Moreover, no visible fillet is found on shorter-base-edge-side of the land 11, on which outline of the land 11 is totally covered by the lead terminal 21. Thus, it is impossible to evaluate whether the bonding between the land 11 and the lead terminal 21 on the shorter-base-edge-side of the land 11 is good or not.

FIG. 6 shows further example of the conventional structure for connecting terminals, as designated as Prior Art 3.

In the construction shown in the FIG. 6, near-square-form rectangular lands 11 are arranged on a wiring board while planar-dumbbell-shaped lead terminals 21 are respectively superimposed on the lands 11. Each lead terminal 21 has larger length-wise dimension and smaller width-wise dimension than those of respective land 11, which are dimensions of long edges 13,14 and short edges 12 of the rectangular land 11. Along long-edge-corresponding portions 23,24 of the each lead terminal 21 both on right-hand side and on left-hand side, arc-shaped recesses 25 are formed. Thus, two short-edge-corresponding portions 22 of the each lead terminal 21 are placed outward from short edges 12 of the respective land 11. Meanwhile, the long-edge-corresponding portions 23,24 of the each lead terminal 21 are inwardly placed than the long edges 13,14 of the respective land 11. Therefore, recesses 25 both on right-hand side and on left-hand side are placed on the land 11.

Fillets 5, which are recognizable from upper side through a wiring board arranged with the lead terminals 21, are formed on long-edge-corresponding portions 23,24 including recesses 25.

The structure shown in the FIG. 6 is disadvantageous because recognition of the fillets 5 would become difficult when position of the lead terminals 21 is deviated in width-wise direction (X direction) of the lands 11 and lead terminals 21. By such deviation, on either of right-hand side or left-hand side of the lead terminal 21, the fillet 5 is formed only along a recess 25. The distance between a recess 25 and a long edge 13 becomes so small by such deviation, that recognition of the fillets 5 becomes difficult on either of right-hand side or left-hand side.

The long edges 13,14 of the each land 11 may be designed to be sufficiently distanced outward from the long-edge-corresponding portions 23,24. However, such design reduces the ratio of superimposed area for the bonding between the land 11 and the lead terminal 21 in terminals-arranging areas on wiring boards.

BRIEF SUMMARY OF THE INVENTION

In view of the above drawbacks, the present invention is aimed to provide a structure for connecting terminals on a wiring board, which structure enables easy evaluation by recognition of the fillets whether bonding of terminals by solder or the like is good or not, while keeping ratio of superimposed area between terminals as sufficiently high among terminal arranging area on a wiring board or other substrate.

According to present invention, a structure for connecting terminals on a wiring board comprising: first terminals arranged on a first substrate; rectangular second terminals arranged on a second substrate and respectively superimposed on first terminals; conductive bonding means electrically and mechanically connecting each of the first terminals to respective one of the second terminals; fillets of the conductive bonding means formed along fringe portions of the each first terminal outwardly protruding from outline of the respective second terminal; a recess being formed on outline of the each first terminal and intersecting with first edge of the respective second terminal; a bump formed on the outline of the each first terminal and intersecting with second edge, opposed to said first edge, of the respective second terminal.

This feature assures a reliable recognition of fillets of the conductive bonding means that connects the first and second terminals.

The conductive bonding means is typically a solder formed of metal alloy. Nevertheless, the conductive bonding means encompasses electro conductive resin pastes, particularly electro conductive adhesives formed of highly viscous resin. The solder encompasses not only lead based ones but also silver based ones or the like and ones having relatively high melting point.

In a preferred aspect, the recess and the bump are shaped substantially as trapezoid.

In another aspect, on each first terminal, shape and size of an outline portion forming the recess are substantially identical with those of another outline portion forming the bump.

In a further aspect, with respect to one of the first terminals and another one of the first terminals next to said one of first terminals, first outline portion of said one of first terminal faces second outline portion of said another one of first terminals in such a manner that the first outline portion is substantially congruent with the second outline portion if shifted in parallel.

DETAILED DESCRIPTION OF THE INVENTION

An embodiment of the present invention is explained in conjunction with the drawings.

Figure 1:
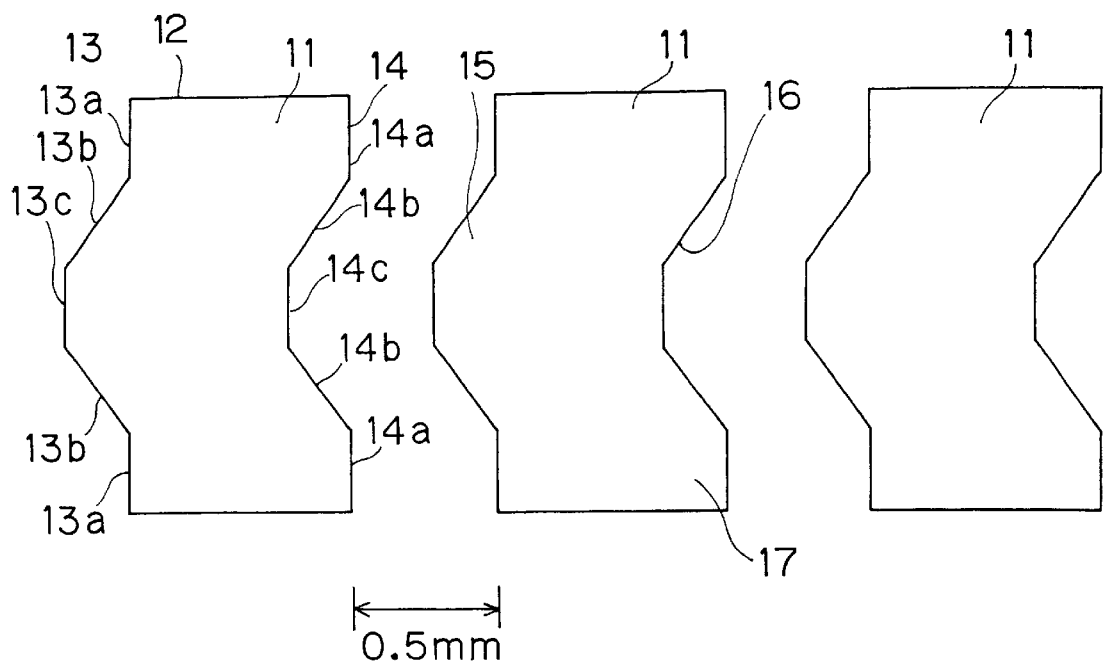
FIG. 1 is a plan view showing outline shape of lands on a wiring board of the Embodiment.
Figure 2:
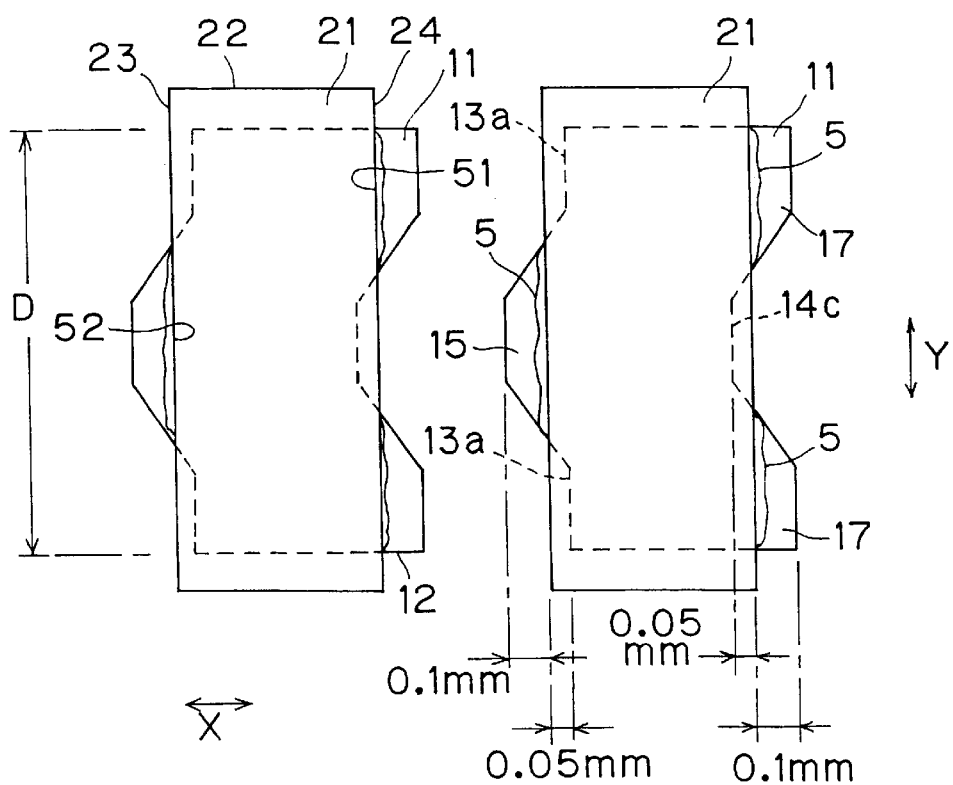
FIG. 2 is a plan view showing essence of a structure for connecting terminals of wiring boards in the Embodiment.

FIG. 1 is a plan view showing outline shape of lands on a first wiring board of the Embodiment; and FIG. 2 is a plan view showing a state in which lead terminals on second wiring board are superimposed on the lands.

Figure 3:
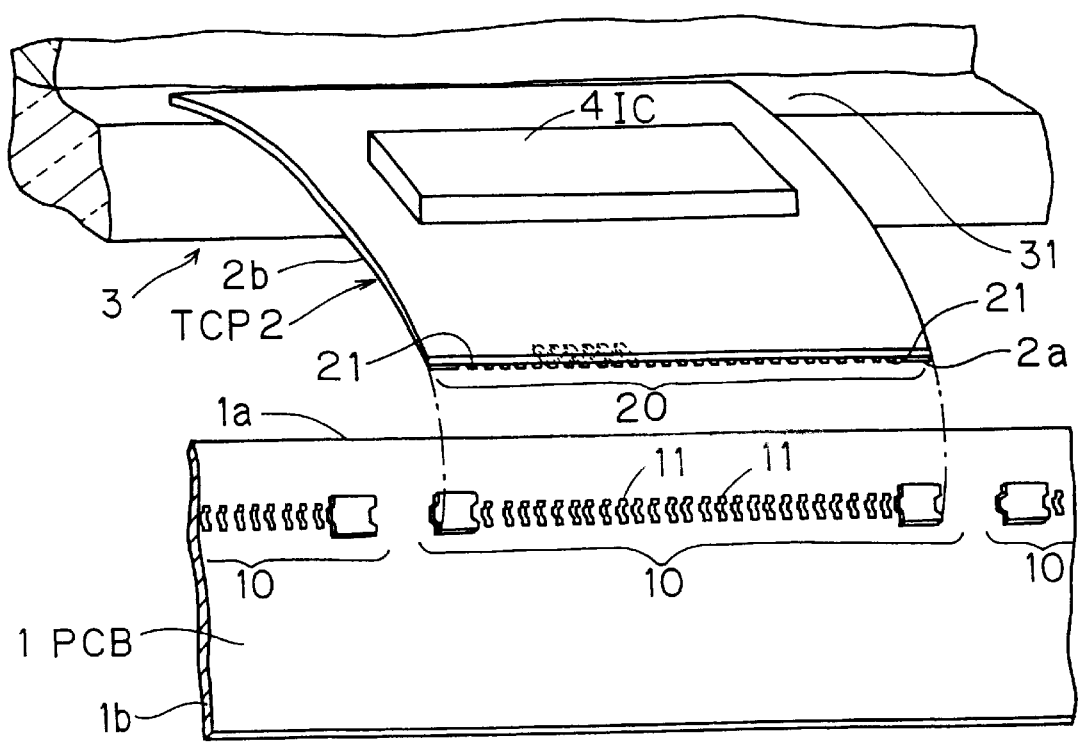
FIG. 3 is a fragmentary perspective view showing an essential part of a flat-panel display device of the Embodiment.
Figure 4:
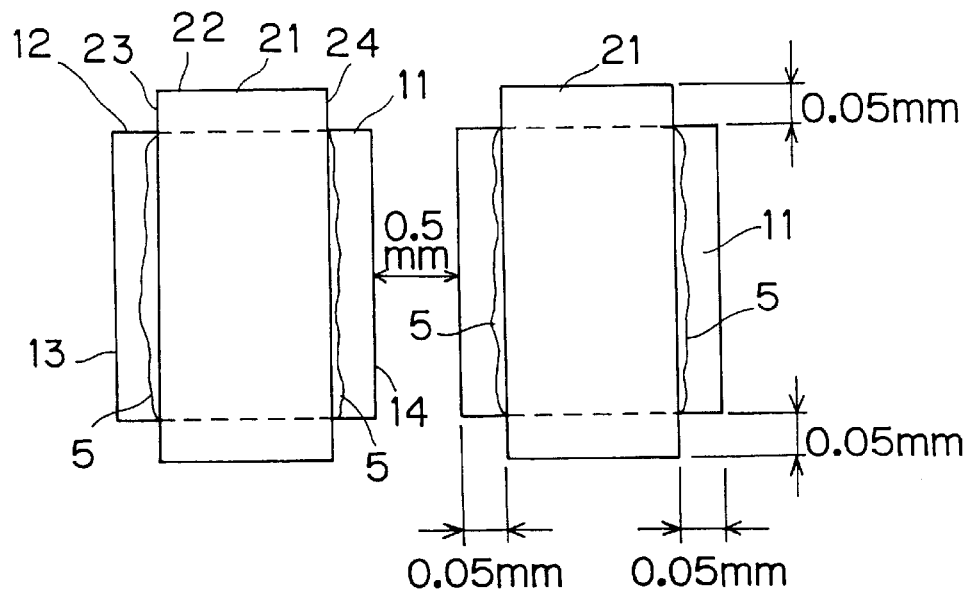
FIG. 4 is a plan view showing essence of a structure for connecting terminals of wiring boards in Prior art 1.
Figure 5:
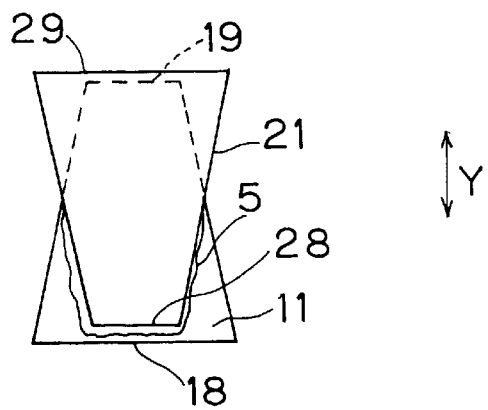
FIG. 5 is a plan view showing essence of a structure for connecting terminals of wiring boards in Prior art 2.
Figure 6:
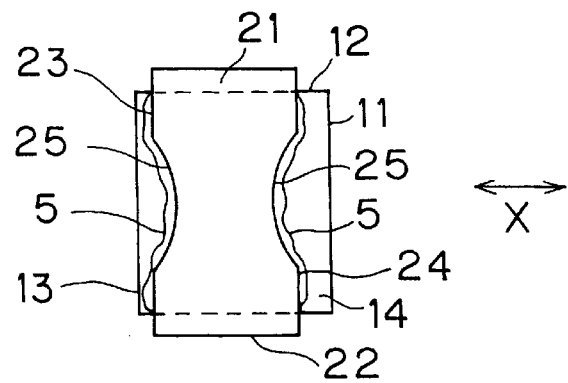
FIG. 6 is a plan view showing essence of a structure for connecting terminals of wiring boards in Prior art 3.

FIG. 3 is a fragmentary perspective view showing an essential part of a flat-panel display device of the Embodiment. In the Embodiment, the first wiring board arranged with the lands 11 is a printed circuit board (PCB) 1 for driving a flat-panel display device. Meanwhile, the second wiring board arranged with the lead terminals is a flexible wiring board 2 which is a tape carrier package (TCP) equipped to the flat-panel display device by outer lead bonding.

As shown in FIG. 3, several flexible wiring boards 2 are bonded onto peripheral connecting portions 31 of display panel proper 3 through anisotropic conductive film (ACF) or the like. A driver IC chip 4 is mounted on around center of the each flexible wiring board 2.

A linear strap-shaped driver printed circuit board (PCB) 1 is arranged along the peripheral connecting portions 31 of display panel proper 3. On the upper face of the PCB 1, several connecting pads group 10 are arranged along a PCB(1)'s edge 1a facing the peripheral connecting portions 31, each connecting pads group 10 being connected with respective input-side terminal group 20 on lower face of the each flexible wiring board 2.

As shown in FIG. 1, the each connecting pads group 10 on the PCB 1 is formed by arranging lands 11 in a side-by-side manner, in a pitch of 0.5 mm, on a flexible insulator substrate 1b. Each land 11 is approximately rectangular with its width-wise direction being a direction (X-direction) of arrangement of the lands 11. An outline of the each land 11 is consisting of a pair of short edge 12 and a pair of long-edge-corresponding portions 13,14. One long-edge-corresponding portion 13 among the pair is consisting of linear portions 13a on both ends and bump 15 therebetween, which bump 15 is shaped substantially as isosceles trapezoid. The bump 15 is consisting of a base line 13c in parallel with the linear portions 13a as well as converging oblique lines 13b that extend in a converging manner with each other from inner ends of the linear portions 13a to ends of the base line 13c.

Meanwhile, another long-edge-corresponding portion 14 among the pair is consisting of linear portions 14a on both ends and recess 16 therebetween, which recess 16 is shaped substantially as isosceles trapezoid. The recess 16 is consisting of a base line 14c in parallel with the linear portions 14a as well as diverging oblique lines 14b that extend in a diverging manner with each other from ends of the base line 14c to inner ends of the linear portions 14a. The two long-edge-corresponding portion 13,14 are congruent with each other when shifted in parallel.

As shown in FIG. 3, the input-side terminals group 20 is consisting of lead terminals 21 arranged along an edge 2a of the flexible wiring board 2. Each lead terminal 21 is rectangular with its long edge being arranged perpendicular to the edge 2a.

As shown in FIG. 2, each rectangular lead terminal 21 on the flexible wiring board 2 is superimposed and bonded electrically and mechanically onto a respective land 11 on the PCB 1 through solder. Long edges 23,24 of the lead terminal 21 are longer than longitudinal length D of the land 11. In the illustrated embodiment, short edges 22 of the lead terminal 21 are shorter than short-edge-corresponding portion 12 of the land 11 by 0.05 mm; length of the short-edge-corresponding portion 12 is tantamount to interval between right and left long-edge-corresponding portions 13,14.

In a plan view as in FIG. 2, as the lead terminal 21 being superimposed on the respective land 11, the bump 15 and the recess 16 of the land 11 on the PCB 1 intersect with respective long edge 23,24 of the lead terminal 21 on the flexible wiring board 2. That is, the converging oblique lines 13b and the diverging oblique lines 14b intersect with either of long edges 23,24 of the lead terminal 21.

In a designed position of superimposition as shown in the figure, the bump 15 of the land 11 protrude from a long edge 23 of the lead terminal 21 by 0.1 mm, while linear portions 13a on both ends of the bump 15 is inwardly distanced from the long edge 23 of the lead terminal 21 by 0.05 mm. Base line 14c of the recess 16 is inwardly distanced from another long edge 24 of the lead terminal 21 by 0.05 mm, while linear portions 14a on both ends of the recess 16 are outwardly distanced from the long edge 24 by 0.1 mm.

Bonding of each land 11 on the PCB 1 with respective lead terminal 21 on the flexible wiring board 2 is made by an automation bonding machine. After solder is mounted on each land 11 or each lead terminal 21 by printing technique or the like, alignment is made to near the designed position; then, automation bonding in use of heat tool is made. In this way, each land 11 and respective lead terminal 21 are bonded electrically and mechanically through solder.

After such solder bonding, on the fringe portion of the land 11 outwardly protruding from the outline of the lead terminal 21, fillets 5 of solder are formed, along long edges 23,24 of the lead terminal 21, to be visible from upper side through the flexible wiring board 2. In detail, fillets 5, which are visible through a thin flexible insulator film 2a comprising the flexible wiring board 2, are formed along a portion 52 of a long edge 23 that intersects the bump 15 and along two portions 51 of another long edge 24 that respectively intersect protrusions 17 offsetting the recess 16; the protrusions 17 are ends part of the long-edge-corresponding portion 14 of the land 11. These fillets 5 contribute to electrical and mechanical bonding between each land 11 and respective lead terminal 21. After completion of the bonding with solder, operator can assess whether the bonding is sufficient or not, by examining whether the fillets 5 are formed in good shape or not.

By the hereto-described embodiment, in plan view, each of the bump 15 and protrusions 17 on each land 11 surely protrudes from rectangular outline of respective lead terminal 21. Such protruding are assured even when position of each lead terminal 21 deviates in a direction (X direction) of arranging the lead terminal 21 with respect to the lands 11, due to deviation of the position of the heat tool for bonding. Either of such protruding is lost only when the deviation in the X direction exceeds designed protruding dimension of the bump 15 and the protrusions 17. In the illustrated embodiment, the designed protruding dimension is 0.1 mm. By such enough and reliable protruding, formation of the fillets 5 along both long edges 23,24 of each lead terminal 21 is easily approvable by observation from upper side through the thin flexible wiring board 2.

Moreover, the fillets 5 are formed over an entire area of superimposition and bonding of each lead terminal 21 with respective land 11, in respect of longitudinal direction (Y direction). Thus, an operator is able to confirm sufficient bonding with the solder in the entire bonding area in the Y direction by approving formation of the fillets 5 in the entire bonding area.

Further, An outward distance from outline of each land 11 to long edges 23,24 of respective lead terminal 21 is set to be smaller than designed protruding-wise dimensions of the bump 15 and the protrusions 17. Thus, the area of superimposition and bonding of each lead terminal 21 with respective land 11 is able to be set sufficiently large. In particular, when the solder is applied on the each lead terminal 21 by printing, formation of balls of the solder or the like is sufficiently suppressed at portions where the outline of each land 11 is placed inward from the long edges 23,24 of respective lead terminal 21.

In the illustrated embodiment, linear portions 13a on both ends of a bump 15 of each land 11 are inwardly distanced from a long edge 23 of respective lead terminal 21 by 0.05 mm. Meanwhile, a base line 14c of a recess 16 is inwardly distanced from another long edge 24 of respective lead terminal 21 by 0.05 mm. Distance of these outline portions 13a, 14c of the land 11 from respective long edges 23,24 are far smaller than the designed protruding dimensions of a bump 15 and a recess 16 which are 0.1 mm.

On the other hand, as shown in FIGS. 1 and 3, bold arch-shaped lands 11 each having a bump 15 and a recess 16 are arranged in a manner that a bump 15 of one land 11 is facing with a recess 16 of next land 11. Moreover, outline portion forming the bump 15 is congruent with outline portion forming the recess 16. Thus, distances in X direction between two neighboring lands 11 are kept constant regardless of Y-direction-wise position in the lands 11. In the illustrated embodiment, the distances are kept at 0.1mm for every two neighboring lands 11. Accordingly, short circuit between the two neighboring lands 11 is sufficiently avoided.

Advantageous effect of the above embodiment is able to be achieved even when outline shape of the lead terminals 21 is exchanged with outline shape of the lands 11—each lead terminal 21 has the recess and the bump while each land 11 is simply rectangular.

What is claimed is:

1. A structure for connecting terminals on a wiring board comprising:
   first terminals arranged on a first substrate;
   rectangular second terminals arranged on a second substrate and respectively superimposed on first terminals;
   conductive bonding means electrically and mechanically connecting each first terminals to respective second terminal;
   fillets of the conductive bonding means formed along fringe portions of each first terminal outwardly protruding from outline of the respective second terminal;
   a recess being formed on outline of the each first terminal and intersecting with a first edge of the respective second terminal; and
   a bump formed on the outline of the each first terminal and intersecting with a second edge, opposed to said first edge, of the respective second terminal.
   thereby said fillets being formed along the first fringe portions and a second fringe portion respectively protruding outwardly from the first and second edges of the respective second terminal, said first fringe portions and said second fringe portion being respectively disposed within protrusions adjacent to the recess and within the bump of each first terminal, opposite to the recess.

2. A structure for connecting terminals on a wiring board according to claim 1, wherein said conductive bonding means is a solder.

3. A structure for connecting terminals on a wiring board according to claim 1, wherein, on each first terminal, shape and size of an outline portion forming the recess are substantially identical with those of another outline portion forming the bump.

4. A structure for connecting terminals on a wiring board according to claim 1, wherein, with respect to one of the first terminals and another one of the first terminals next to said one of first terminals, first outline portion of said one of first terminal faces second outline portion of said another one of first terminals in such a manner that the first outline portion is substantially congruent with the second outline portion if shifted in parallel.

5. A structure for connecting terminals on a wiring board according to claim 1, wherein the recess and the bump are substantially trapezoid.

6. A structure for connecting terminals on a wiring board according to claim 5, wherein base lines of trapezoid shape forming the recess and the bump are arranged to be substantially parallel with long edges of said second terminal.

7. A structure for connecting terminals on a wiring board according to claim 5, wherein the recess and the bump are substantially isosceles trapezoid.

8. A structure for connecting terminals on a wiring board according to claim 5, wherein ends of the recess and ends of the bump are connected with ends of linear outline portions that are substantially parallel with long edges of said second terminal.

9. A structure for connecting terminals on a wiring board according to claim 1, wherein said second terminals are lead terminals arranged on a flexible wiring board.

10. A structure for connecting terminals on a wiring board according to claim 1, wherein said first terminals are lead terminals arranged on a flexible wiring board.

11. A structure for connecting terminals on a wiring board according to claim 1, wherein said first terminals are lands arranged on a print circuit board for driving a flat-panel display device while said second terminals are input-side terminals arranged on a tape carrier package for inputting drive signals to a display panel.

12. A structure for connecting terminals on a wiring board according to claim 1, wherein said second terminals are lands arranged on a print circuit board for driving a flat-panel display device while said first terminals are input-side terminals arranged on a tape carrier package for inputting drive signals to a display panel.

* * * * *